United States Patent [19]
Bonges, III et al.

[11] Patent Number: 5,101,120
[45] Date of Patent: Mar. 31, 1992

[54] BICMOS OUTPUT DRIVER

[75] Inventors: Henry A. Bonges, III, Milton; Roy C. Flaker, Essex Junction, both of Vt.

[73] Assignee: International Business Machines Corporation, Armonk, N.Y.

[21] Appl. No.: 701,392

[22] Filed: May 16, 1991

[51] Int. Cl.⁵ .................. H03K 19/02; H03K 3/33
[52] U.S. Cl. ........................... 307/446; 307/300
[58] Field of Search ............. 307/446, 300, 443, 481, 307/592

[56] References Cited

U.S. PATENT DOCUMENTS

| | | |
|---|---|---|
| 4,808,850 | 2/1989 | Masuda et al. ............ 307/446 |
| 4,849,658 | 7/1989 | Iwamura et al. ........... 307/481 |
| 4,890,018 | 12/1989 | Fukushi et al. ............ 307/446 |
| 4,902,914 | 2/1990 | Masuoka .................... 307/446 |

Primary Examiner—David Hudspeth
Assistant Examiner—Andrew Sanders
Attorney, Agent, or Firm—Mark F. Chadurjian

[57] ABSTRACT

A BICMOS output driver in which a bipolar device is driven by a control signal that biases the collector of an NFET. The control signal enables the bipolar to pull an output node to full potential (ground) quickly. The signal then falls within one nanosecond after the output reaches ground, pulling the bipolar out of saturation. A separate feedback device coupled between the base of the bipolar and ground can be added to pull the bipolar out of saturation before the control signal falls.

18 Claims, 3 Drawing Sheets

BICMOS OUTPUT DRIVER

BACKGROUND OF THE INVENTION

1. Technical Field

The invention relates generally to circuits fabricated using a combination of bipolar and complementary metal oxide silicon transistors (hereinafter BICMOS), and more particularly to a BICMOS output circuit.

2. Background Art

BICMOS technology has gained increasing acceptance in the industry, because it combines the low power attributes of traditional CMOS designs with the high speed attributes of bipolar transistor technology. BICMOS is particularly applicable to static random access memories (SRAMs), especially those operating in the sub 10 ns access range, where bipolar devices are used to quickly drive sensed data off the chip and CMOS devices are used to provide low power memory cells.

In conventional push-pull BICMOS output drivers of the prior art, it is known to use CMOS devices to drive bipolar output devices coupled to high and low power supplies. A general concern that must be addressed in such circuits is how to provide a full voltage swing at the output (that is, an output voltage within 0.1 volts of a power supply potential) with fast rise/fall times (switching speeds).

This problem is discussed and illustrated in an article by Puri et al., "Non-Inverting BIFET Buffer Circuit," *IBM Technical Disclosure Bulletin*, Vol. 23, No. 2, July 1990 pp. 283-85. The circuit discussed in the article is illustrated in FIG. 1 (Prior Art). Transistors Q5 and Q6 are NPN bipolar transistors; the remaining transistors are FETs, wherein transistors Q2-Q4 are n-channel FETs (NFETs) and transistor Q1 is a P-channel FET (PFET). The output is driven by bipolars Q5 and Q6 in a "push-pull" configuration. That is, when the input voltage IN is low, Q5 turns on to "push" the output to VDD. When IN is high, Q6 turns on to "pull" the output to ground. However, since the base of Q6 is driven positive to pull the output low, Q6 could go into saturation since the base voltage becomes higher than the collector voltage as the output is pulled low. A simple solution to this problem is to couple the drain of FET Q3 to the output, such that the base of Q6 is connected to the collector of Q6 by FET Q3, such that Q6 will never go into saturation.

Most of the BICMOS art couples the source of the driver FET to the output, to limit the drive on the base of the bipolar as in the Puri et al. article. Examples include Puri et al., "Improved BIFET Circuit," *IBM Technical Disclosure Bulletin*, Vol. 33, No. 1A, June 1990 pp. 274-78; U.S. Pat. No. 4,616,146 (Lee et al.—Motorola); U.S. Pat. No. 4,649,295 (McLaughlin et al.—Motorola); U.S. Pat. No. 4,694,203 (Uragami et al.—Hitachi); U.S. Pat. No. 4,779,014 (Masuoka et al.—Toshiba); U.S. Pat. No. 4,845,385 (Ruth—Silicon Connections Corp.); U.S. Pat. No. 4,845,386 (Ueno—Toshiba); U.S. Pat. No. 4,849,658 (Iwamura et al.—Hitachi); U.S. Pat. No. 4,879,480 (Suzuki et al.—Hitachi); U.S. Pat. No. 4,890,018 (Fukushi et al.—Fujitsu); U.S. Pat. No. 4,933,574 (Lien et al.—Integrated Device Technology, Inc.); U.S. Pat. No. 4,970,414 (Ruth—Silicon Connections Corp.); U.S. Pat. No. 4,977,337 (Ohbayashi et al.—Mitsubishi); Japanese Application 63-4713 (Kanzawa et al—Hitachi); and Japanese Application 01-270412.

The prior art that clamps the base voltage to the output through the control FET reduces the voltage swing at the output. That is, in order to prevent saturation, the base voltage is reduced as the output (i.e. the collector voltage) drops, throughout the output drive cycle. Dropping the base voltage also reduces the transistor drive, such that the transistor conducts less current. As a result, the switching time at the output increases, and the collector voltage does not reach the full power supply potential.

Thus, in the prior art concern about saturation limited performance. That is, because base drive was reduced in order to keep the bipolar out of saturation these circuits provide less than a fast transition full voltage swing by approximately 1 Vbe (0.8 volts). As CMOS voltages are reduced due to device scaling, this reduction in voltage swing can eliminate BICMOS speed advantages over CMOS.

Accordingly, a need has developed in the art for a BICMOS driver that provides full voltage swings and fast switching times without consuming excessive power.

SUMMARY OF THE INVENTION

It is thus an object of the present invention to provide a BICMOS driver that produces full voltage swings at its output.

It is another object of the invention to provide a BICMOS driver that produces fast switching times without consuming excessive power.

It is yet another object of the invention to provide a BICMOS driver of relatively simple construction and operation, while producing full voltage swings and fast switching times without consuming excessive power.

The foregoing and other objects of the invention are realized by a BICMOS driver that utilizes a clocked FET drive device. The source of the driver FET receives a clock signal, whose rise and fall times are controlled such that the base drive of the bipolar is retained throughout the pulldown cycle. As a result, the bipolar output is pulled quickly to a full supply potential. At this point the bipolar goes into saturation. However, because the clock signal is directly passed to the bipolar, the fall of the clock will turn off the bipolar with minimum delay.

An aspect of the invention is that feedback from the output is no longer absolutely required to keep the bipolar out of saturation. In the invention, should feedback be required in order to pull the bipolar out of saturation before the clock signal falls, it is no longer necessary to follow the output directly or through a passive resistance. Rather, in another embodiment of the invention the output is fed back to the gate of a second FET coupled between the base of the bipolar and the power supply. As such, the feedback can be applied only when needed, at the end of the drive cycle.

BRIEF DESCRIPTION OF THE DRAWING

The foregoing and other features and teachings of the invention will become more apparent upon a review of the detailed description thereof as rendered below. In the description to follow, reference will be made to the accompanying Drawing, in which.

DETAILED DESCRIPTION OF THE BEST MODE FOR CARRYING OUT THE INVENTION

Figure 2:
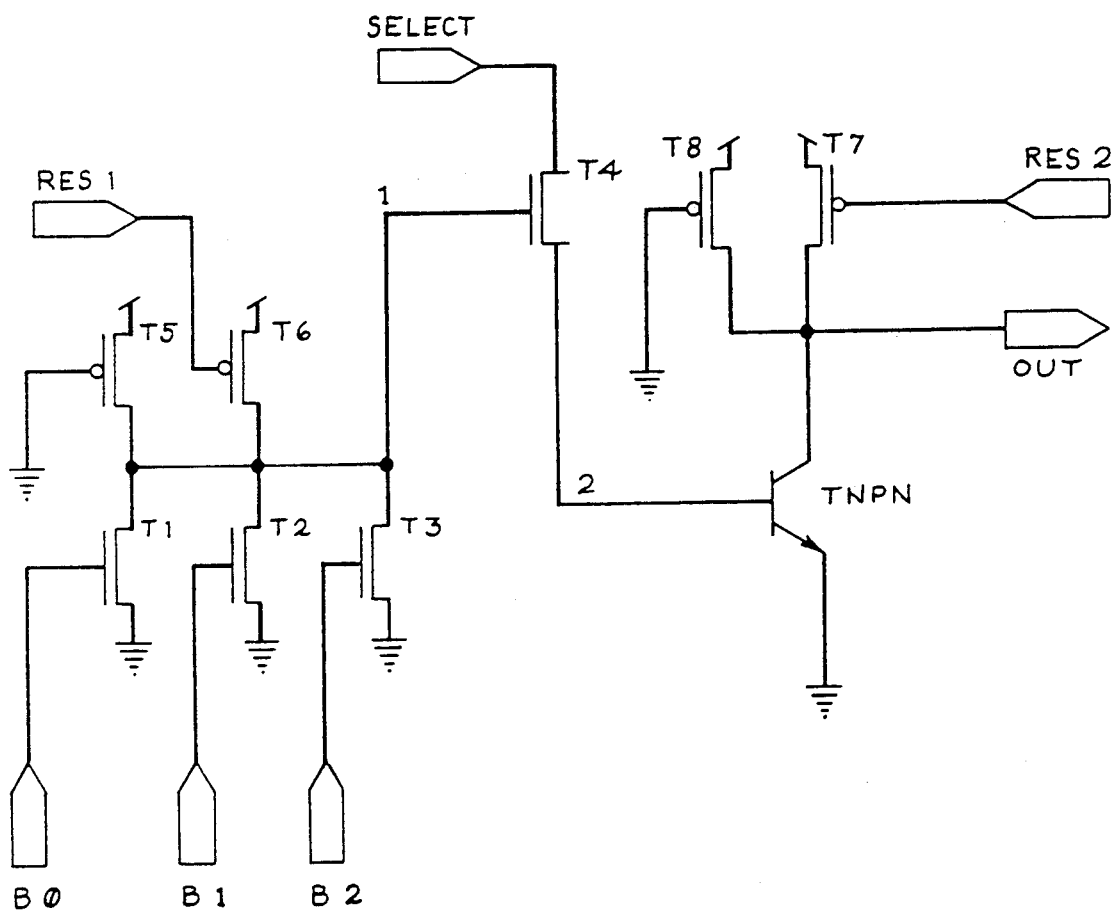
FIG. 2 is a circuit diagram of a first embodiment of the BICMOS driver of the invention.

With reference to FIG. 2, the first embodiment of the invention will now be described. In FIG. 2, TNPN is an NPN bipolar transistor; transistors T1-T4 are NFETs, and transistors T5-T8 are PFETs. T4 receives an enable signal on its gate. The enable signal originates from NOR node 1 of a standard CMOS NOR decoder that receives various address signals B0-B2 at T1-T3, respectively. When the received address signals select the word line driven by this decoder, Node 1 (precharged high by T5 and T6) will stay high, maintaining a high voltage on T4. For unselected decoders, Node 1 falls to ground, turning T4 off. The source of T4 is coupled to receive a drive signal SELECT. The SELECT pulse rises to turn the driver on after the decoding operation of T1-T3 is complete. Thus, only the output of the selected decoder will be driven by the SELECT signal.

The drain of NFET T4 is coupled to the base of an NPN bipolar transistor TNPN. The emitter of TNPN is coupled to a power supply (ground), and the collector is coupled to the drive output OUT. PFET T8 is used to keep the voltage at OUT at the high power supply if the driver is not selected, and PFET T7 receives a signal RES2 to restore the OUT voltage high after the drive cycle is completed.

The circuit works as follows. During standby OUT is at the high power supply voltage VH (typically 3.3 volts) via T8. The SELECT clock signal rises at the start of the drive cycle. Of all the decoders, only the selected decoder with Node 1 high will have T4 turn on. Note that due to the gate-to-drain inversion capacitance of T4, the gate temporarily bootstraps by up to 0.5 volts or so above the 3.3 supply, which has the effect of turning on the bipolar very quickly, at a relatively high drive current. As a result TNPN turns on very quickly, pulling the voltage on OUT toward the low power supply (ground). The SELECT pulse stays high even when the collector voltage falls below the base voltage during the drive cycle, which temporarily puts TNPN into saturation. The SELECT pulse is timed to turn off approximately one-two nanoseconds after T4 turns on. Within this time, OUT has fallen to approximately 0.03 volts. When SELECT turns off, because node 1 is still high the base of TNPN quickly drops to low potential, pulling TNPN out of saturation. Subsequently, the RES2 pulse turns T7 on, restoring OUT high.

Thus, in the invention a full voltage swing is achieved within one nanosecond. Studies comparing the performance of the invention with a conventional push-pull CMOS driver show that the invention produces this voltage swing up to 65% faster than its CMOS counterpart. At the same time, the excessive power burn that would normally result from allowing the bipolar transistor to go into saturation in order to provide this full voltage swing is eliminated by turning off the bipolar drive in a timed manner (that is, via SELECT going low), as opposed to using an analog feedback tied to the output that reduces the base drive throughout the drive cycle.

Figure 3:
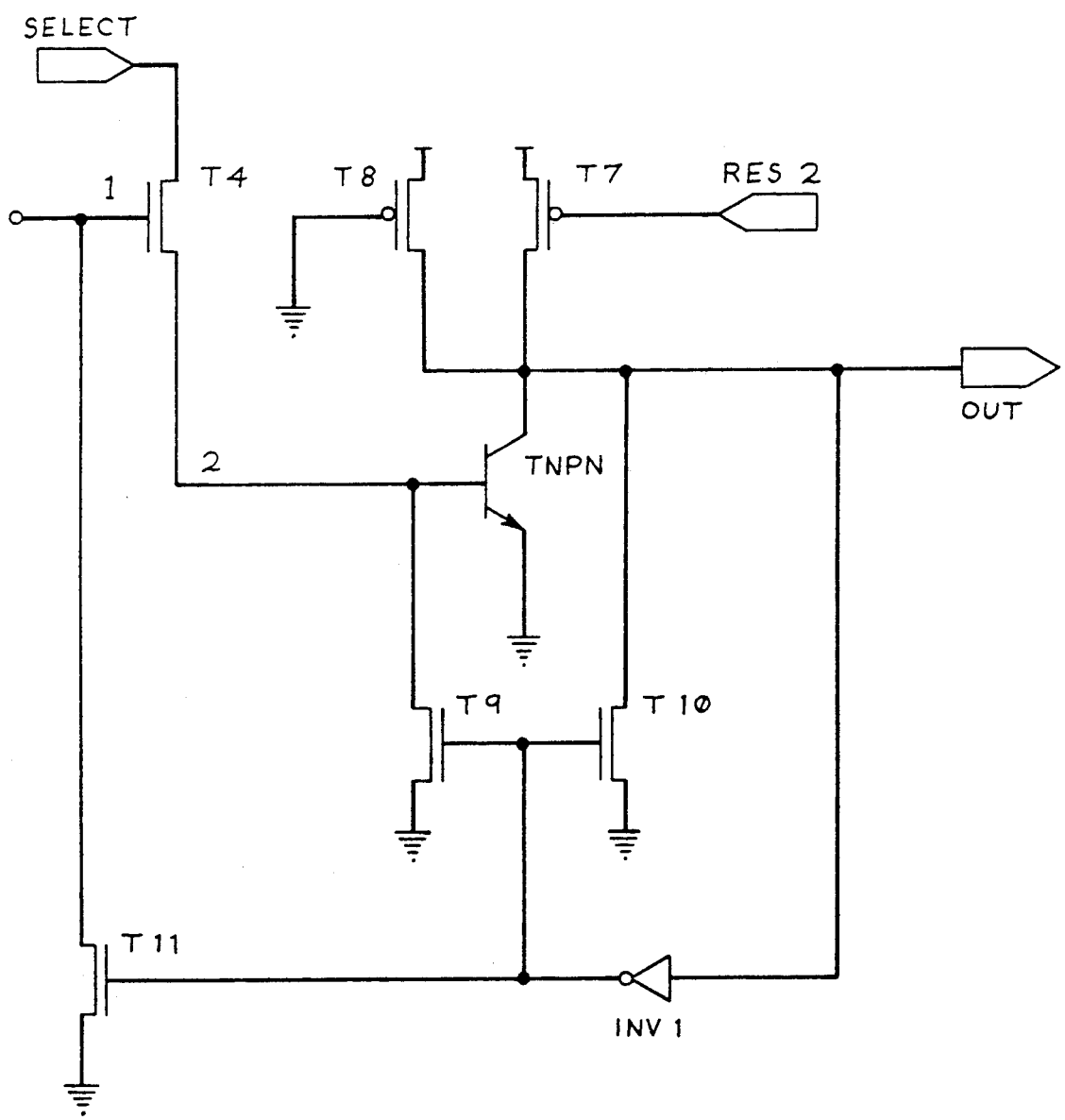
FIG. 3 is a circuit diagram of a second embodiment of the BICMOS driver of the invention.

FIG. 3 illustrates another feature of the invention. In FIGS. 2 and 3, transistors and signals having the same reference numerals and names are the same. For ease of illustration, only the driver portion of the circuit is shown; Node 1 in FIG. 3 receives the same decoder output as Node 1 in FIG. 2. In FIG. 3, transistors T9-T11 are all NFETs. In some applications TNPN may pull the output low early enough such that there is a time delay between when the output falls and when SELECT turns off. In such a state the bipolar would begin to consume excessive power. To prevent this from occurring, NFET T9 has been added in a feedback loop to pull TNPN out of saturation. As OUT falls, it reaches the switch point (typically around one volt or so) of CMOS inverter INV1, and the gate voltage of T9 rises. When T9 turns on, the low power supply is coupled to the base directly, to turn off TNPN quickly. At the same time, NFET T11 turns on to discharge Node 1 to ground. Node 1 going low turns off T4, to isolate SELECT from the base of the bipolar TNPN and eliminate the DC path from SELECT through T4 and T9 to ground. NFET T10 is added to clamp OUT to ground at the same time TNPN is disabled.

Figure 1:
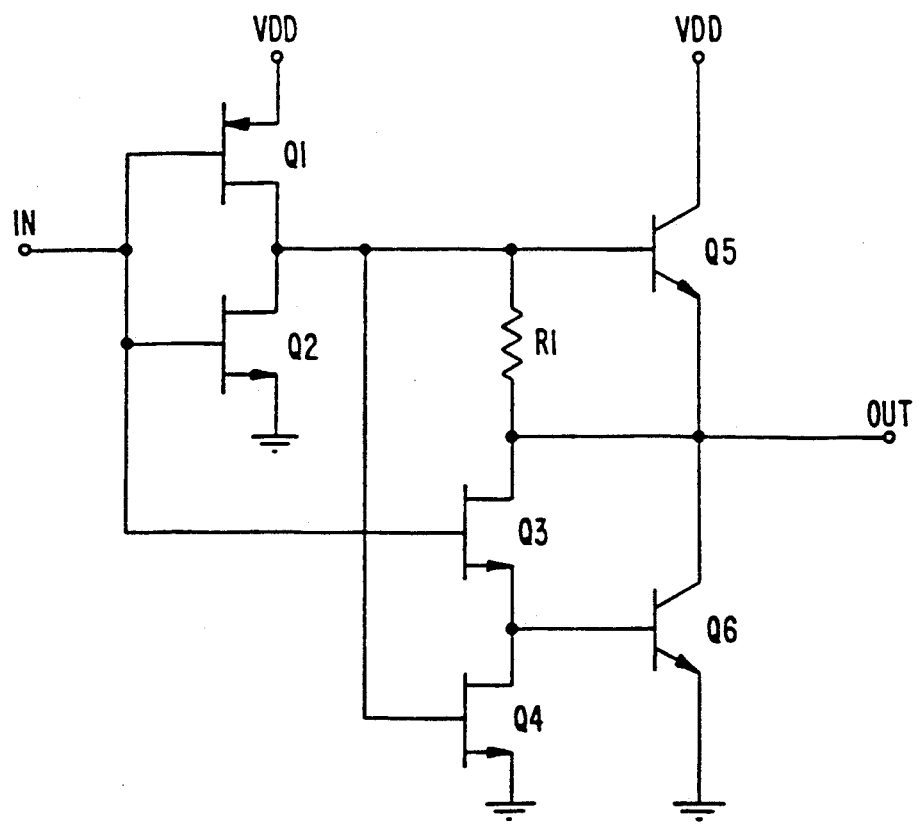
FIG. 1 (Prior Art) is a circuit diagram of a BICMOS driver of the prior art.

So, in the second embodiment of the invention, we have added feedback to limit the amount of time the bipolar is in saturation. As opposed to the prior art, in the invention this feedback does not keep the output from reaching full voltage swing. This is because the feedback is clocked via INV1, and because a power supply voltage (ground) is used to source the base drive current. That is, rather than relying on feedback from the output to drive the base throughout the drive cycle as in FIG. 1, in the invention the feedback directly clamps the base voltage low only when needed, at the end of the drive cycle. This is controlled by the switch point of INV1. So, the feedback from the output is more in the nature of an enable signal, because the output enables T9 which gates a power supply. As a result, the feedback of the embodiment of the invention shown in FIG. 3 works in a manner similar to that of FIG. 2; the circuit permits controlled saturation to provide full voltage swings and fast rise/fall times, while pulling the bipolar out of saturation quickly to avoid consuming excessive power.

It will be apparent to those of ordinary skill in the art that various modifications can be made to the structures and teachings described above without departing from the spirit and scope of the present invention. For example, while the invention has been described with reference to a pull-down driver, it can be applied to a driver that provides a high output voltage by switching the polarities of the devices. Also, the invention could be applied as the driver portion of any BICMOS circuit that is to produce a clocked output, rather than being limited to the decoder application described herein.

We claim:

1. An output driver, comprising
 a first field effect transistor having a control electrode receiving an enable signal, a first controlled electrode receiving a drive signal, and a second controlled electrode;
 an output node; and
 a first bipolar transistor having a base electrode coupled to said second controlled electrode of said first field effect transistor, a collector electrode coupled to said output node, and an emitter electrode coupled to a power supply,
 said first field effect transistor biasing said base electrode of said first bipolar transistor at a high potential when both of said drive signal and said enable signal are active, said drive signal becoming inactive shortly after said output node has a voltage that is approximately the same as said power supply.

2. The output driver of claim 1, wherein said enable signal is generated by a decoder.

3. The output driver of claim 1, wherein said first field effect transistor is an NFET.

4. The output driver of claim 3, wherein said first bipolar transistor comprises an NPN transistor.

5. The output driver of claim 1, further comprising a second field effect transistor having a gate electrode coupled to said output node, a first controlled electrode coupled to said power supply, and a second controlled electrode coupled to said base electrode of said first bipolar transistor.

6. The output driver of claim 5, wherein said second field effect transistor comprises an NFET, and wherein an inverter is coupled between said output node and said gate electrode of said second field effect transistor.

7. A BICMOS output circuit, comprising:
a first field effect transistor having a gate electrode receiving an enable signal, a first controlled electrode receiving a drive signal, and a second controlled electrode;
an output node;
a first bipolar transistor having a base electrode coupled to said second controlled electrode of said first field effect transistor, an emitter electrode biased at ground potential, and a collector electrode coupled to said output node,
wherein said first bipolar transistor biases said output node to approximately ground potential when both of said enable signal and said drive signal are active such that said first bipolar transistor goes into saturation, and wherein said drive signal becomes inactive within two nanosecond after said said output node reaches ground potential to pull said first bipolar transistor out of saturation.

8. The BICMOS output circuit of claim 7, wherein said first field effect transistor is an NFET, and wherein said first bipolar transistor is an NPN transistor.

9. The BICMOS output circuit of claim 8, further comprising
first means coupled between said output node and said base electrode of said first bipolar transistor for pulling said first bipolar transistor out of saturation after said output node is biased at approximately ground potential and before said drive signal becomes inactive.

10. The BICMOS output circuit of claim 9, wherein said first means comprises a second field effect transistor having a gate electrode coupled to said output node, a first controlled electrode biased at ground potential, and a second controlled electrode coupled to said base electrode of said first bipolar transistor.

11. The BICMOS output circuit of claim 10, further comprising
inverter means coupled between said output node and said gate electrode of said second field effect transistor.

12. The BICMOS output circuit of claim 10, wherein said second field effect transistor is an NFET.

13. A BICMOS circuit, comprising:
first means for producing an enable signal;
second means receiving both of said enable signal and a drive signal, for passing said drive signal to an output when said enable signal is active;
a bipolar transistor having a base electrode receiving said output of said second means, an emitter electrode biased at ground potential, and a collector electrode coupled to an output node;
said second means enabling said bipolar transistor, when both of said enable signal and said drive signal are active, to pull said output node to ground potential, said second means also pulling said bipolar transistor out of saturation after said output node reaches ground potential.

14. The BICMOS circuit of claim 13, wherein said first means comprises a decoder.

15. The BICMOS circuit of claim 13, wherein said second means comprises a first NFET having a gate electrode receiving said enable signal, a first controlled electrode receiving said drive signal, and a second controlled electrode coupled to said base electrode of said bipolar transistor.

16. The BICMOS circuit of claim 15, further comprising
an inverter coupled to said output node; and
a second NFET having a gate electrode coupled to an output of said inverter, a first controlled electrode biased at ground potential, and a second controlled electrode coupled to said base electrode of said bipolar transistor.

17. The BICMOS circuit of claim 16, further comprising
a third transistor having a gate electrode receiving a restore signal, a first controlled electrode coupled to said output node, and a second controlled electrode biased at VH.

18. A BICMOS output circuit, comprising:
a first field effective transistor having a gate electrode receiving an enable signal, a first controlled electrode receiving a drive signal, and a second controlled electrode;
an output node;
a first bipolar transistor having a base electrode coupled to said second controlled electrode of said first field effect transistor, an emitter electrode biased at ground potential, and a collector electrode coupled to said output node,
wherein said first bipolar transistor biases said output node to approximately ground potential when both of said enable signal and said drive signal are active such that said first bipolar transistor goes into saturation, and wherein said drive signal becomes inactive after said said output node reaches ground potential to pull said first bipolar transistor out of saturation; and
first means coupled between said output node and said base electrode of said first bipolar transistor for pulling said first bipolar transistor out of saturation after said output node is biased at approximately ground potential and before said drive signal becomes inactive.

* * * * *